(12) United States Patent
Sharma et al.

(10) Patent No.: US 10,284,194 B2
(45) Date of Patent: May 7, 2019

(54) HIGH GAIN LOAD CIRCUIT FOR A DIFFERENTIAL PAIR USING DEPLETION MODE TRANSISTORS

(71) Applicant: Analog Devices, Inc., Norwood, MA (US)

(72) Inventors: Yogesh Jayaraman Sharma, Santa Clara, CA (US); James Fiorenza, Carlisle, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 14/959,567

(22) Filed: Dec. 4, 2015

(65) Prior Publication Data

US 2016/0164517 A1   Jun. 9, 2016

Related U.S. Application Data

(60) Provisional application No. 62/087,987, filed on Dec. 5, 2014.

(51) Int. Cl.
*H03K 5/22* (2006.01)
*H03K 17/687* (2006.01)
(Continued)

(52) U.S. Cl.
CPC ....... *H03K 17/6871* (2013.01); *H01L 27/088* (2013.01); *H01L 29/2003* (2013.01);
(Continued)

(58) Field of Classification Search
CPC .......................... H03F 3/45179; H03F 3/45278
(Continued)

(56) References Cited

U.S. PATENT DOCUMENTS 5,132,560 A * 7/1992 Kane ................... H03F 3/45744
327/65
5,966,005 A * 10/1999 Fujimori ................. G05F 3/262
323/315
(Continued)

FOREIGN PATENT DOCUMENTS

CN        102136460 A      7/2011   ............. H01L 23/26

OTHER PUBLICATIONS

Liu, X, L, et al. "GaN Single-Polarity Power Supply Bootstrapped Comparator for High-Temperature Electronics," IEEE Election Device Letters, vol. 32, No. 1, pp. 27-29, Jan. 1, 2011.*
(Continued)

*Primary Examiner* — Ryan Jager
(74) *Attorney, Agent, or Firm* — Schwegman Lundberg & Woessner, P.A.

(57) ABSTRACT

A differential pair gain stage is disclosed. In one embodiment, the gain stage includes a differential pair of depletion-mode transistors, including a first and a second n-type transistor. In certain embodiments of the invention, the depletion mode transistor may be GaN (gallium nitride) field effect transistors. The gain stage includes an active load including one or more depletion mode transistors electrically coupled to at least one of the drains of depletion mode transistors of the differential pair. The active load may include a source follower for maintaining the AC voltages at the drains of the differential pair at a constant value and may further include a casocde stage for setting a fixed drain source voltage across the output transistors to increase the output impedance and gain of the stage.

24 Claims, 13 Drawing Sheets

(51) Int. Cl.
   *H01L 27/088* (2006.01)
   *H01L 29/20* (2006.01)
   *H03F 3/45* (2006.01)

(52) U.S. Cl.
   CPC ..... *H03F 3/45188* (2013.01); *H03F 3/45385* (2013.01); *H03F 2200/303* (2013.01); *H03F 2200/75* (2013.01); *H03F 2203/45036* (2013.01); *H03F 2203/45182* (2013.01); *H03F 2203/45184* (2013.01); *H03F 2203/45188* (2013.01); *H03F 2203/45202* (2013.01); *H03F 2203/45208* (2013.01); *H03F 2203/45224* (2013.01); *H03F 2203/45656* (2013.01); *H03F 2203/45674* (2013.01); *H03F 2203/45676* (2013.01); *H03F 2203/45701* (2013.01); *H03F 2203/45702* (2013.01); *H03F 2203/45722* (2013.01)

(58) Field of Classification Search
   USPC .......................................................... 327/108
   See application file for complete search history.

(56) References Cited

U.S. PATENT DOCUMENTS

| | | | | |
|---|---|---|---|---|
| 6,087,899 | A * | 7/2000 | Kubota | H03F 1/48 330/253 |
| 6,590,914 | B1 | 7/2003 | Tanase et al. | 372/38.02 |
| 7,019,590 | B1 * | 3/2006 | Megaw | H03F 3/45183 330/253 |
| 7,312,660 | B2 * | 12/2007 | Koh | H03F 3/45183 330/253 |
| 7,859,339 | B2 * | 12/2010 | Ide | H03F 3/45183 330/257 |
| 8,090,334 | B1 * | 1/2012 | Yahav | H03F 3/245 330/254 |
| 8,378,747 | B2 * | 2/2013 | Aisu | H03F 3/45188 330/257 |
| 8,766,720 | B2 | 7/2014 | Mitchell et al. | 330/253 |
| 2001/0010479 | A1 * | 8/2001 | Yano | H03K 5/2481 327/541 |
| 2006/0061391 | A1 * | 3/2006 | Tam | H03K 19/09432 326/115 |
| 2013/0112992 | A1 | 5/2013 | Kurtz et al. | 257/77 |
| 2013/0307622 | A1 * | 11/2013 | Tanaka | H03F 3/45076 330/257 |

OTHER PUBLICATIONS

Abidi, A., "An Analysis of Bootstrapped Gain Enhancement Techniques," *IEEE Journal of Solid-State Circuits*, vol. 23, No. 6, pp. 1200-1204, Dec. 6, 1987.

Abidi, A., "On the Operation of Cascode Gain Stages," *IEEE Journal of Solid-State Circuits*, vol. 23, No. 6, pp. 1434-1437, Dec. 1, 1988.

Larson, L., et al., "Session 111: Sampled-Data Analog Circuits WAM 3.1: GaAs Switched-Capacitor Circuits for Video Signal Processing," *IEEE*, 3 pages, Feb. 25, 1987.

Maralani, A, et al., "Design of a Silicon Carbide JFET Based Operational Amplifier for Gain and CMRR Performance," *Circuits and Systems, IEEE*, pp. 1953-1956, May 24, 2009.

Xiao, S., et al., "Improved Double Cascode Self-Bootstrapping Technique for Gain Enhancement in GAAS MESFET OPAMPS," *Electronic Letters*, vol. 28, No. 12, pp. 1128-1129, Jun. 4, 1992.

European Patent Office Wienema, David—Authorized Officer, Notification of Transmittal of the International Search Report and the Written Opinion of the International Searching Authority, or the Declaration, PCT/US2015/063996; 15 pages, dated Apr. 1, 2016.

Dupuy, V., et al., "A 2.4GHz to 6GHz Active Balun in GaN Technology," Abstract, *IEEE*, 2 pages, 2013.

Hussain, T., et al., "GaN HFET Digital Circuit Technology," *IEEE*, 3 pages, 2003.

Liu, X., et al., "GaN Single-Polarity Power Supply Bootstrapped Comparator for High Temperature Electronics," Abstract, *IEEE*, vol. 32, Issue 1, 2 pages, 2011.

Maroldt, S., et al., "High Efficiency Digital GaN MMIC Power Amplifiers for Future Switch-Mode Based Mobile Communication Systems," Abstract, *IEEE*, 2 pages, 2009.

Nomoto, K., et al., "High Temperature Operation of GaN Based OPAMP on Silicon Substrate," Abstract, *Research Gate*, 1 page, 2010.

* cited by examiner

Vout =Vo

HIGH GAIN LOAD CIRCUIT FOR A DIFFERENTIAL PAIR USING DEPLETION MODE TRANSISTORS

PRIORITY

The present application claims the benefit of U.S. Provisional Patent Application 62/087,987 filed on Dec. 5, 2014, which is incorporated herein by reference in its entirety.

FIELD OF THE INVENTION

The invention generally relates to depletion mode transistors and, more particularly, the invention relates to a differential pair gain stage using depletion mode transistors, such as, gallium nitride transistors.

BACKGROUND OF THE INVENTION

As should be understood by one of ordinary skill in the art, depletion mode field effect transistors are in an "on" state when the gate voltage is equal to the source voltage of the transistor, such that current will flow through the drain source juncture of the transistor. A depletion mode device can be turned "off" when the gate voltage is taken below the source voltage by the threshold voltage when current stops flowing through the drain source junction of the transistor.

Some fabrication technologies are either technically limited or cost limited to fabricating only depletion mode field effect transistors. For example, Gallium Nitride (GaN) is presently one such fabrication technology.

Design of analog integrated circuits in Gallium Nitride (GaN) fabrication technology is beginning to gain traction due to its significant benefits over silicon. Specifically, among other things, GaN fabrication technology benefits include high bandwidth, high temperature operation and high breakdown voltages. This is largely due to the fact that GaN has a higher bandgap voltage than silicon (3.49 eV vs 1.1 eV) and higher critical breakdown field (3 MV/cm vs 0.3 MV/cm). At the same time, the fabrication of GaN circuits on a silicon (Si) substrate has made the technology affordable and applicable for a wider range of applications.

The variety of GaN transistor device choices, however, is limited. While n-type depletion and enhancement mode devices are available, p-type GaN devices are not available as they have poor performance due to fundamental device physics issues. Hence the challenge is to make analog circuits using only n-type depletion and enhancement mode devices.

Figure 1:
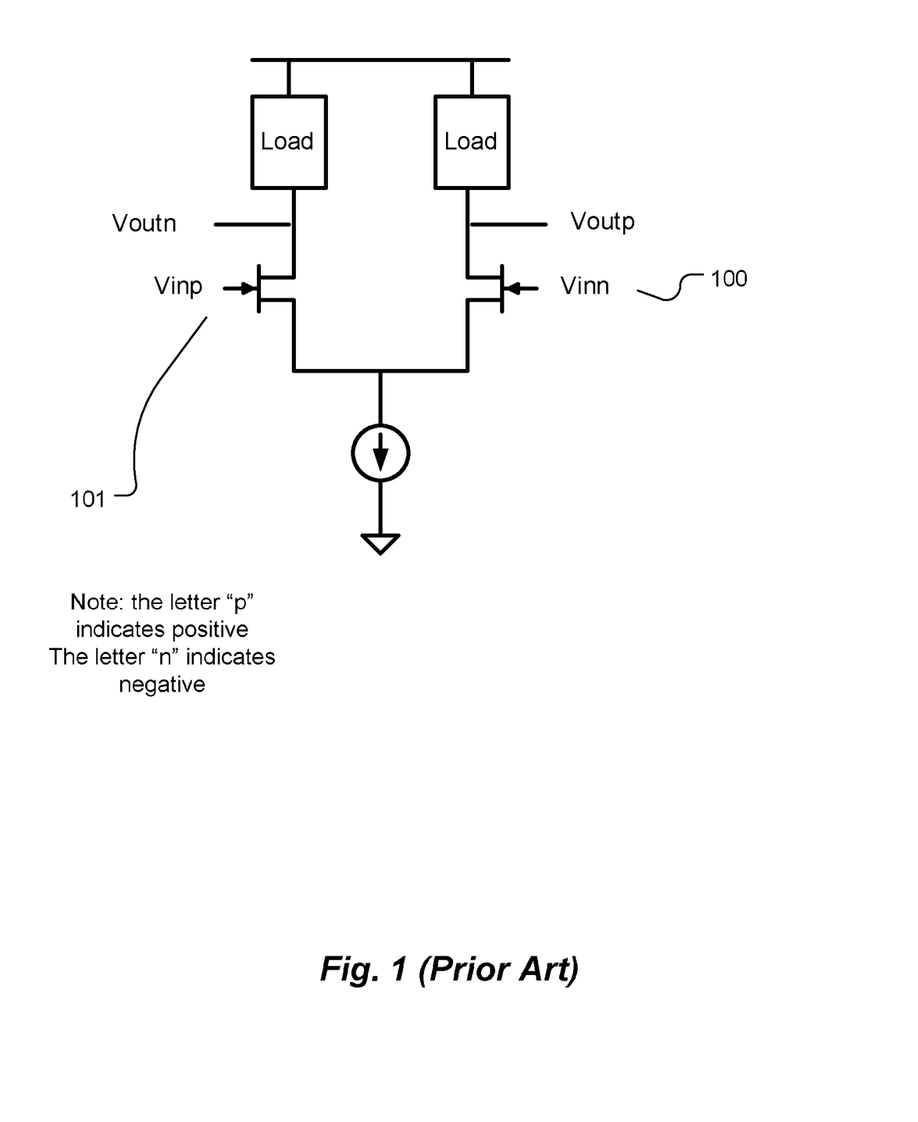
FIG. 1 schematically shows a prior art elementary analog circuit in silicon—a gain block that has a differential pair driving load devices.

FIG. 1 schematically shows one prior art elementary analog circuit—a gain block that has of a differential pair 100, 101 driving load devices 105, 106. This block provides a differential signal gain while rejecting common mode signals. Getting the highest differential gain out of this circuit is important for building a wide array of high performance analog circuits.

Figure 2:
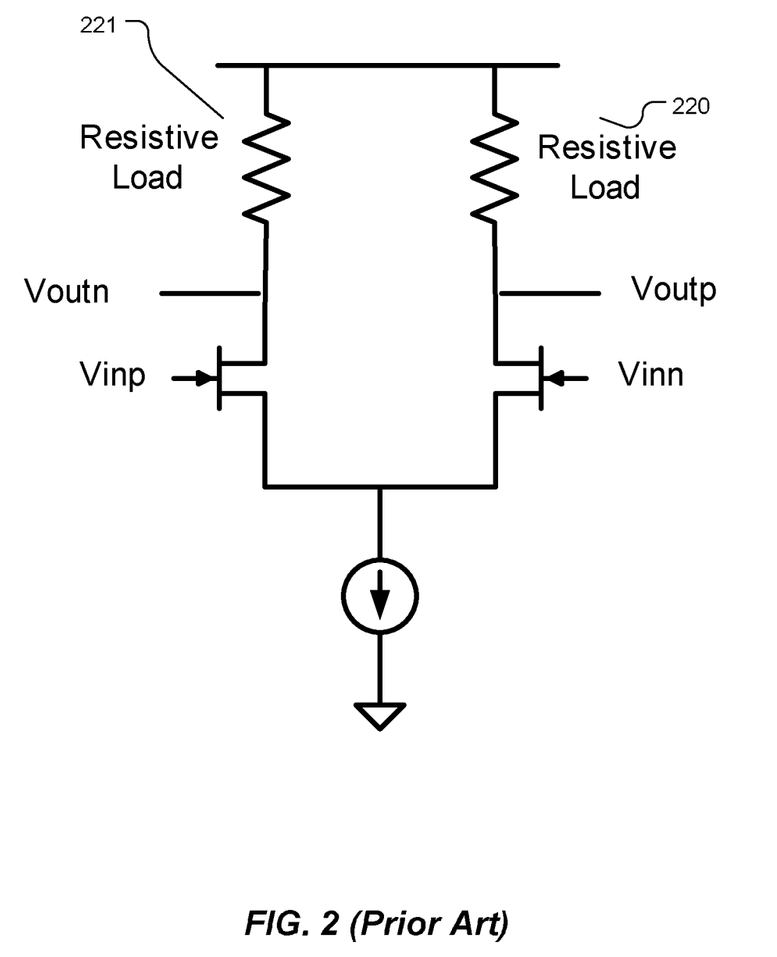
FIG. 2 schematically shows a prior art silicon-based differential circuit loaded with resistors.
Figure 3:
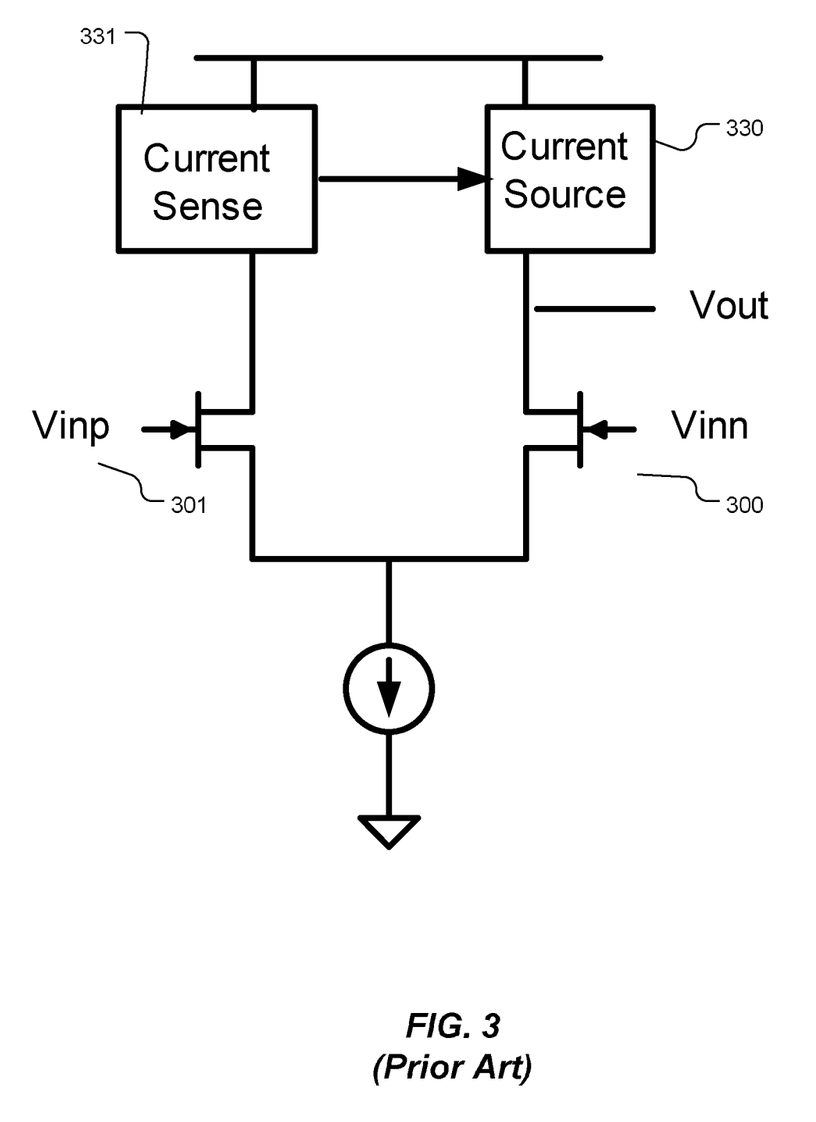
FIG. 3 schematically shows a silicon-based prior art differential circuit with a current mirror.

A differential pair of two transistors 100 and 101 when formed in silicon and operating in enhancement mode, such as that shown in FIG. 1, can be loaded with a wide array of load device choices. One choice uses load resistors 220, 221 and is schematically shown in FIG. 2. This circuit has poor gain because the resistors 220, 221 cannot be made sufficiently large as the resistor has to conduct the DC bias current, thus the resistors need to be small. Ideally this circuit could have a current mirror (made of a current sense 331 and a current source device 332) for the load devices of the differential pair 300, 301 as shown in FIG. 3.

Figure 4:
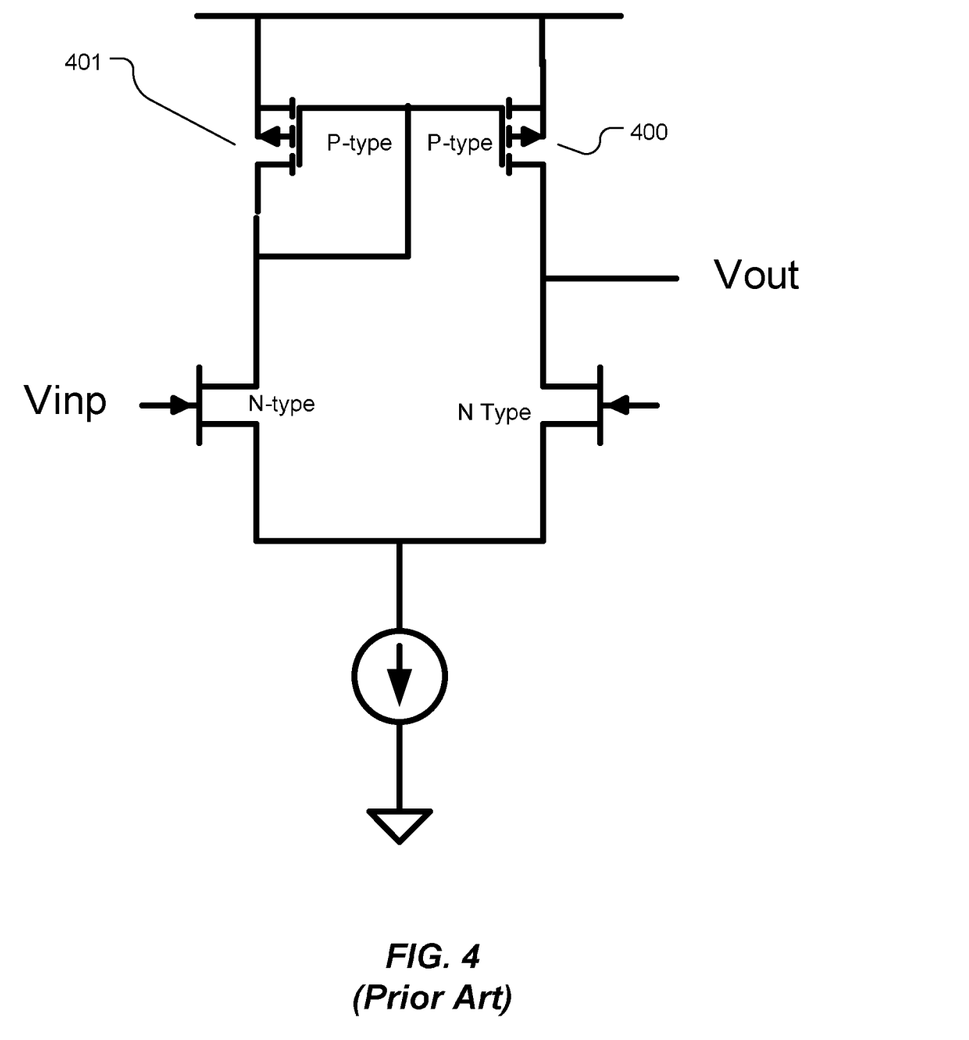
FIG. 4 schematically shows a silicon-based prior art circuit with a current mirror using p-type transistors.

The high output impedance of the current source 332 normally provides good differential gain while the current source can provide the DC bias current as needed. In silicon, p-type transistors 400, 401 typically are easily used to design the current mirror (FIG. 4). Undesirably, this option currently is not available in the GaN fabrication process.

SUMMARY OF THE EMBODIMENTS

Embodiments of the invention include a depletion mode differential pair gain stage. The gain stage includes a differential pair of depletion-mode transistors, including a first and a second n-type transistor. In certain embodiments of the invention, the depletion mode transistor may be GaN (gallium nitride) field effect transistors. The transistors have a gate, source, and a drain and the differential pair coupled at the source of each transistor forming a common node. The gain stage also includes an active load including one or more depletion mode transistors electrically coupled to at least one of the drains of depletion mode transistors of the differential pair.

The differential pair may also include a constant current source coupled to a common node of the differential pair. The current source can be used for biasing the differential pair.

In embodiments of the invention, the active load includes a current source formed from a third depletion mode transistor coupled to a resistor. The current source of the active load electrically couples the gate of the third depletion mode transistor to the drain of the second n-type depletion mode transistor of the differential pair.

In yet another embodiment of the invention the active load include a buffer formed from at least a fourth depletion mode transistors electrically coupling the drains of the first and second n-type depletion mode transistors of the differential pair. The buffer ideally has a substantially unity gain, which causes the output impedance to increase. The gain of the buffer may be substantially unity such that any gain between 0.5 and 1 would at least double the output impedance and increase the overall gain.

The buffer of the active load may be formed as a source follower in which a depletion mode transistor has its gate electrically coupled to the current source formed from the third depletion mode transistor. The source follower of the buffer causes the AC voltage at the drains of the differential pair to remain at the same potential. By having the AC voltage at the drains remain at the same potential the biasing current from the common node will be split between the two sides of the differential pair.

The gain stage may be further enhanced by increasing the output impedance of the circuit. A cascade stage can be added to the active load to maintain a fixed voltage above the threshold voltage of the depletion mode transistor across the drain of at least the source the depletion mode transistor that forms the source follower.

Depletion mode transistors of any fabrication type may be used with the circuit topology described herein to create a differential pair gain stage and this gain stage can be used in the formation of an operational amplified. Fabrication techniques may include silicon and gallium nitride for example. Embodiments of the present invention can be used in high bandwidth, high gain applications and can be employed with high voltage supplies >50V and operate at high temperatures, such as the temperatures that GaN circuits have been known to function.

In yet another embodiment of the invention, the differential pair is made up of n-type enhancement mode transistors and the active load includes only n-type depletion mode transistors. Gain enhancement may be achieved with an n-type depletion mode transistor as a source follower so that the AC voltage of the drains of the differential pair are equal. The differential pair gain stage may further be enhanced with a cascode stage that causes the drain/source junction of at least one n-type depletion mode transistor in the active load to have a constant voltage. The constant voltage causes the output impedance to be increased.

BRIEF DESCRIPTION OF THE DRAWINGS

Those skilled in the art should more fully appreciate advantages of various embodiments of the invention from the following "Description of Illustrative Embodiments," discussed with reference to the drawings summarized immediately below.

DESCRIPTION OF ILLUSTRATIVE EMBODIMENTS

Figure 5A:
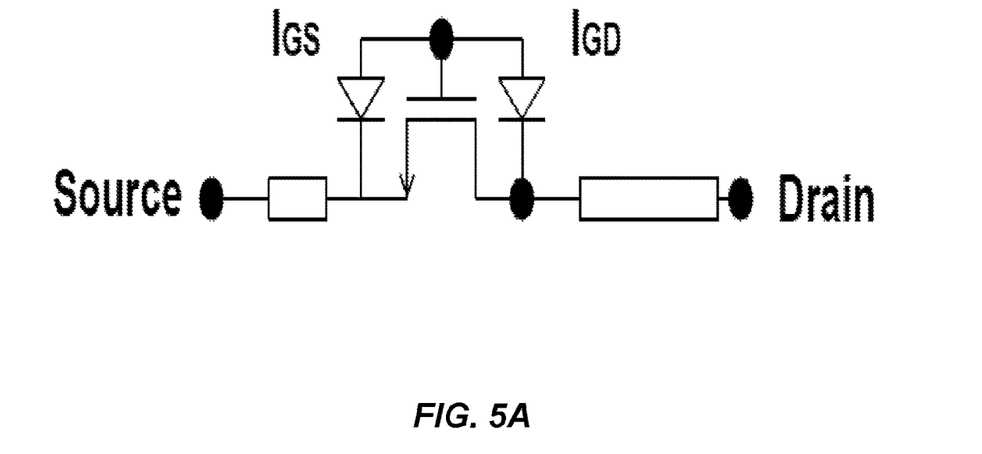
FIG. 5A schematically shows an exemplary depletion mode transistor having a gate, a drain, and a source.

Embodiments of the present invention are implemented using depletion mode field effect transistors such as n-type gallium nitride (GaN) field effect transistors. Although GaN transistors will be referenced within the specification, embodiments of the circuit topology are not limited to GaN transistors. Rather, embodiments of the present invention are directed to depletion mode transistors and the creation of a high gain differential pair stage that includes depletion mode transistors that operates over a wide frequency band and can be used as a gain stage in the creation of an operational amplifier. FIG. 5A schematically shows a depletion mode transistor (e.g. a GaN n-type depletion transistor). The transistor is a field effect transistor that contains a source, a drain, and a gate. As explained above, depletion mode field effect transistors are in an "on" state when the gate voltage is equal to the source voltage of the transistor, such that current will flow through the drain source juncture of the transistor. A depletion mode device can be turned "off" when the gate voltage is taken below the source voltage by the threshold voltage when current stops flowing through the drain source junction of the transistor.

Figure 5B:
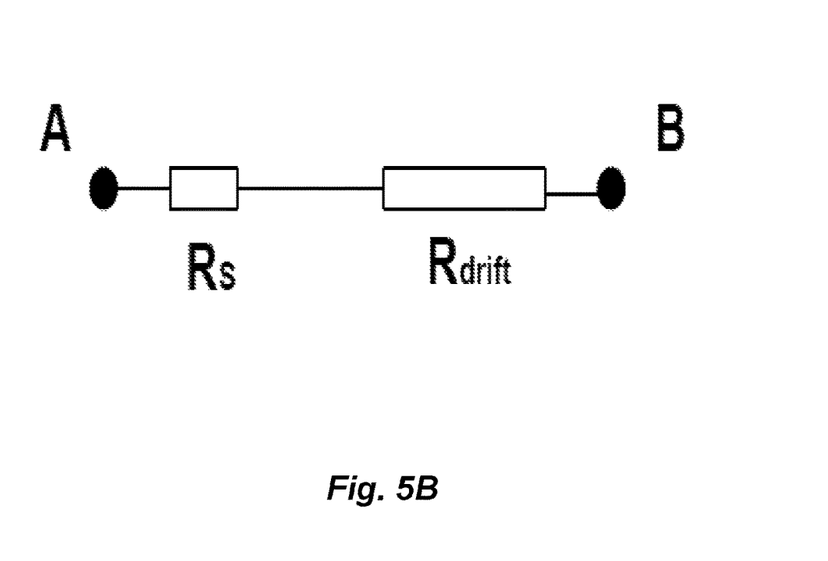
FIG. 5B schematically shows an exemplary depletion mode transistor converted into a resistor by removing the gate.
Figure 5C:
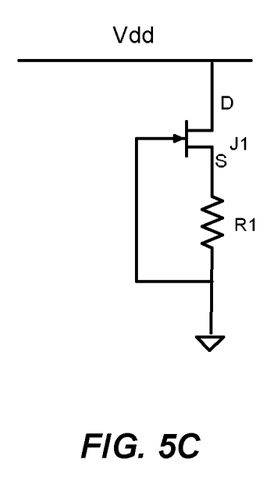
FIG. 5C schematically shows an exemplary current source created from a depletion mode transistor in combination with a resistor coupled to the gate of the transistor.

As shown in FIG. 5B, a resistor can be created from a GaN transistor by eliminating the gate, which produces a diffusion resistor. As shown in FIG. 5C a current source can be formed out of GaN n-type transistors by forcing a threshold voltage across a GaN diffusion resistor by coupling one side of the resistor to the gate of an n-type transistor while the other side of the resistor is connected to the source of the transistor. The GaN current source between the drain and gate of the transistor behaves as current source up to approximately 150V at the drain of the transistor. Variations in the current source are due mainly to the variation in the threshold voltage of the GaN transistors. The output impedance of a GaN current source is approximately 3MΩ and can be increased with a set of cascoded transistors to greater than 20MΩ. As shown in the exemplary current source in FIG. 5C, the current source is formed by forcing the threshold voltage across the diffusion resistor. In this example the gate of depletion mode transistor J1 is at ground and the potential at the source of transistor J1 is approximately 3.5V assuming that the transistor is a GaN n-type depletion transistor. Thus, the transistor draws a constant current equal to 3.5V/depletion mode resistor value.

Figure 5D:
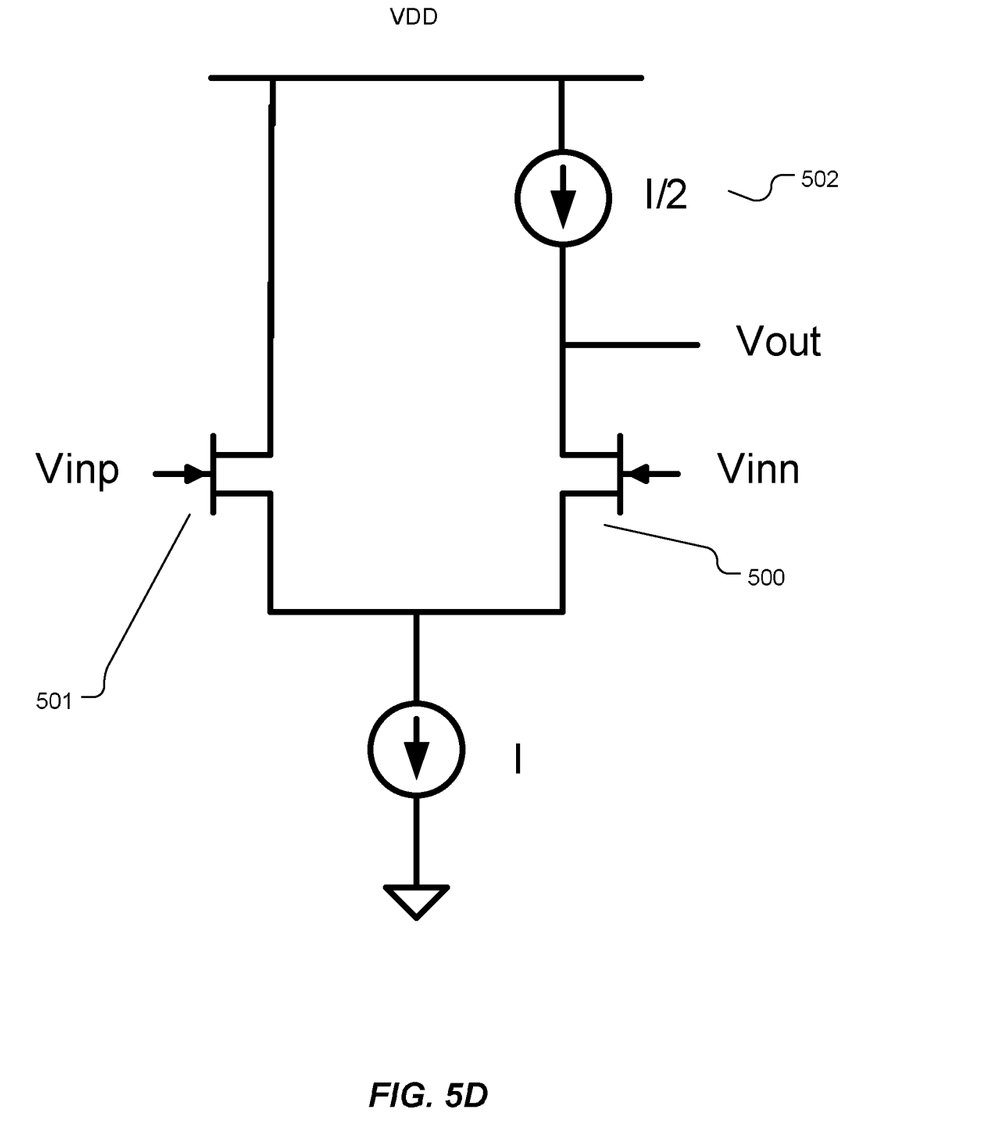
FIG. 5D schematically shows one embodiment of the present invention using depletion mode transistors to form a differential pair with an active load such that the current is equal in both sides of the differential pair.
Figure 7:
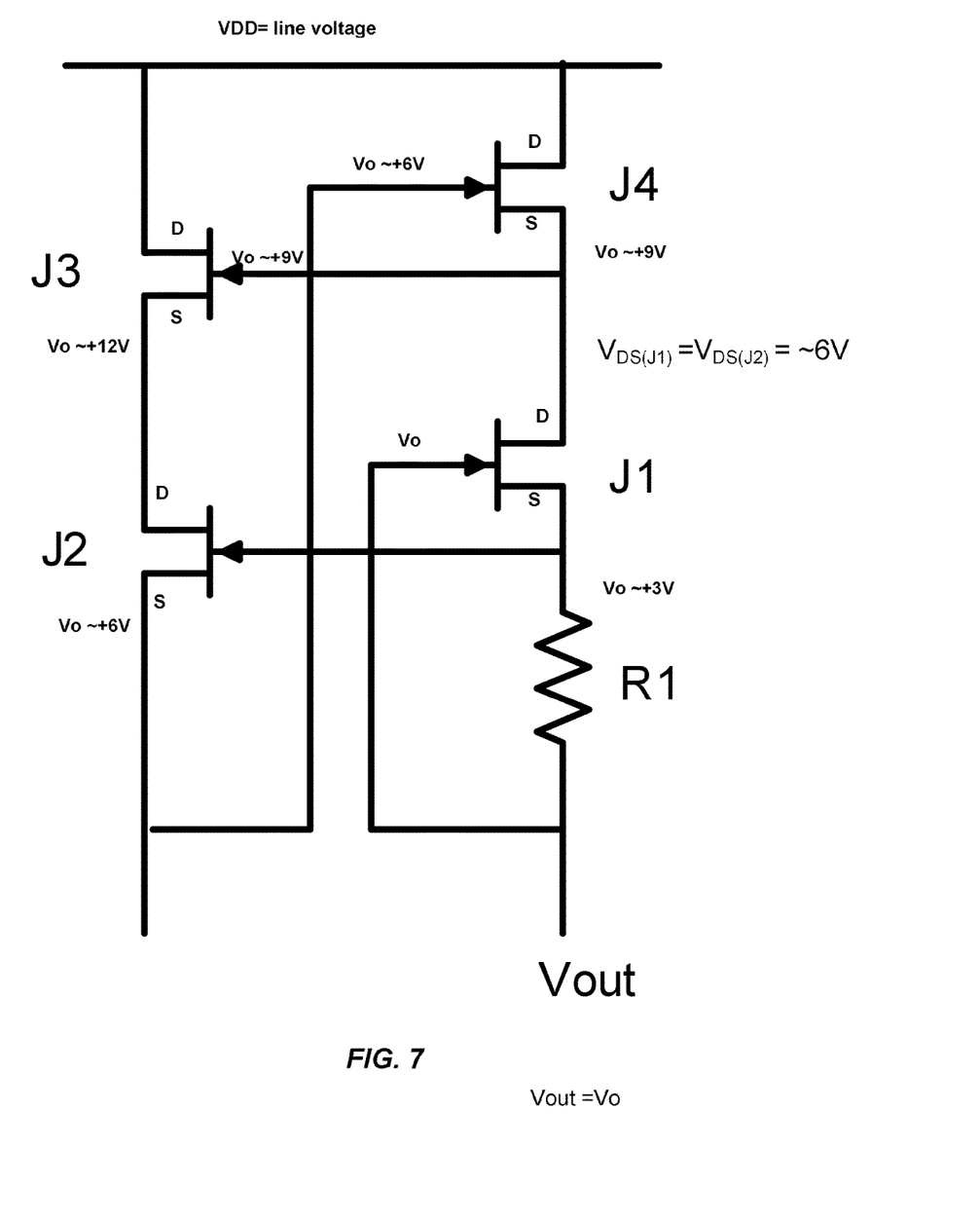
FIG. 7 illustratively shows the design of the high side current mirror using depletion mode devices in accordance with illustrative embodiments of the invention.

Examples of a current source with a set of cascoded transistors is shown in FIG. 7 These cascoded transistors help increase the output impedance of the gain stage. The behavior of the current source can FIG. 5D schematically shows one embodiment of the present invention where the output impedance of a single ended depletion mode differential pair is $r_{ds}$, and the transconductance of the differential pair is $g_{m1}$. The differential voltage gain is $g_{m1} \times r_{ds}$. The output impedance of the differential pair is limited by the output impedance of the device 501.

Figure 5E:
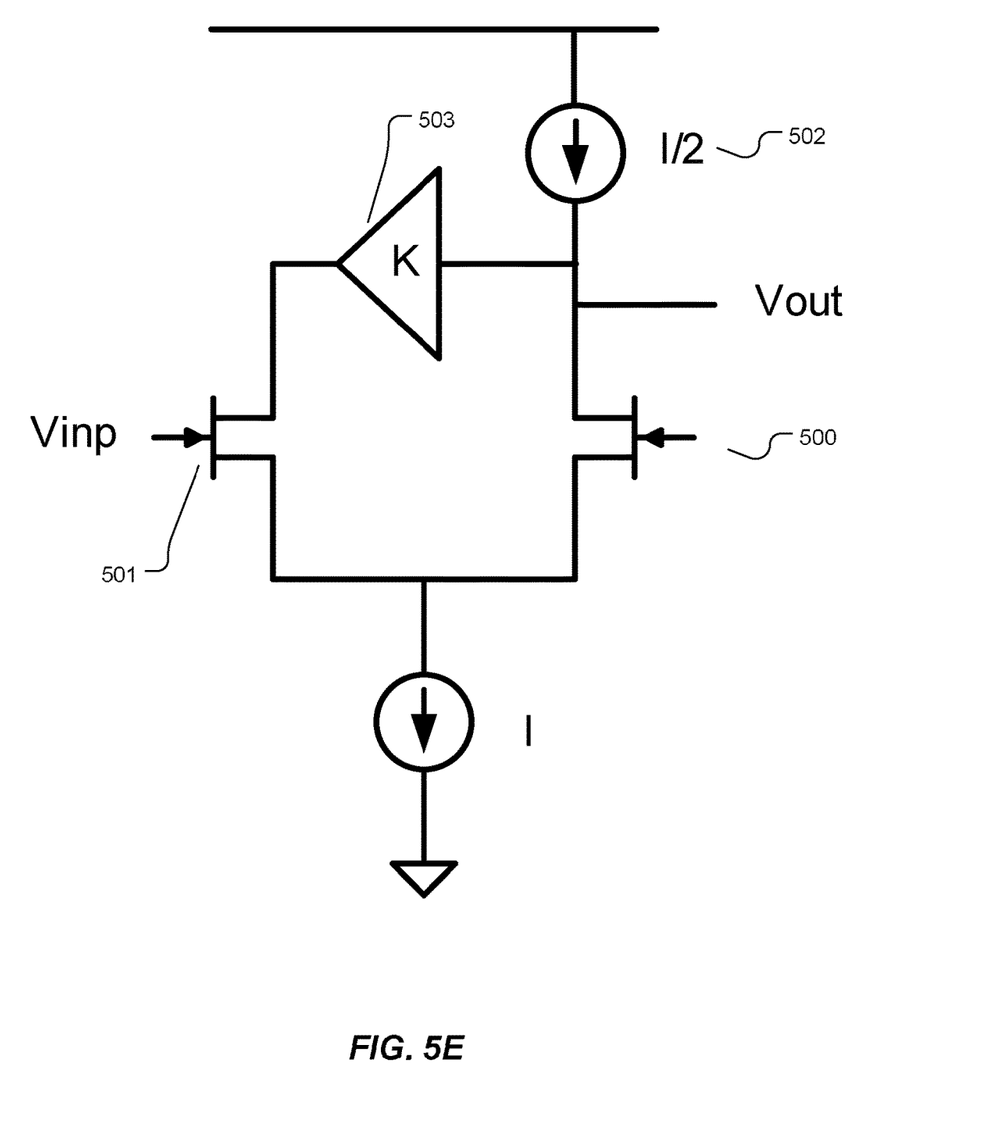
FIG. 5E schematically shows an embodiment of a depletion mode transistor circuit having a buffer with gain K close to unity for causing the current to be equal in both sides of the differential pair and the drain voltage to be equal for both sides of the differential pair.

The output impedance of one side of the differential pair can be increased further by keeping the two drains of the differential pair at the same potential. In FIG. 5E, a buffer 503 with gain K (close to unity) keeps the AC drain voltages close to each other. In this configuration:

$$R_{out} = \frac{r_{ds}}{(1-K)}$$

For K close to 1, the output impedance can be increased significantly. The term substantially unity is used in this specification and the appended claims and the term refers to values of K close to 1 including K=0.5 up to K=1. At K=0.5 the voltage gain is doubled as the output impedance is doubled. In addition, illustrative embodiments further enhance this design by double cascoding the current source, as explained below.

Figure 6:
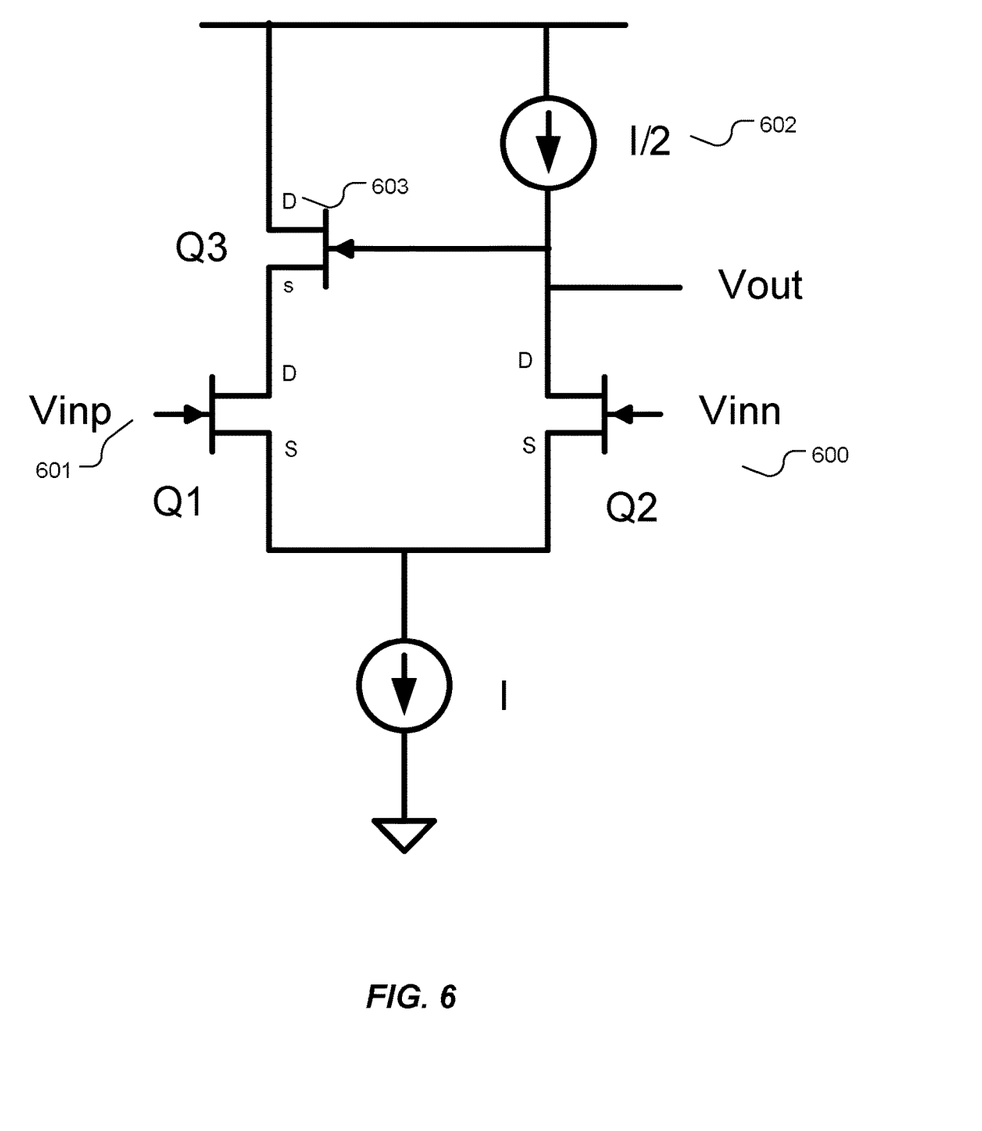
FIG. 6 schematically shows an embodiment of a depletion mode transistor circuit with a source-follower transistor forcing the AC voltage at the drains of two transistors of the differential pair to be equal.

In one illustrative implementation, shown in FIG. 6, the source-follower transistor Q3 (603) forces the AC voltage at the drain of Q1 (601) and Q2 (600) to be equal. As is known to one of ordinary skill in the art, in a source follower circuit the AC source voltage of Q3 (603) (which is also the AC drain voltage of Q1 (601) follows the AC voltage at the gate of the transistor Q3. In this configuration, the voltage gain is:

$$A_v = g_{m1} \times \frac{r_{ds1}}{\frac{(1+g_{m1}r_{ds1})}{(1+g_{m2}r_{ds2})} - \frac{g_{m3}r_{ds3}}{(1+g_{m3}r_{ds3})}}$$

Where
gm1 is the transconductance of device Q1
rds1 is the drain to source impedance of device Q1
gm2 is the transconductance of device Q2
rds2 is the drain to source impedance of device Q2
gm3 is the transconductance of device Q3
rds3 is the drain to source impedance of device Q3

This expression reduces to $(g_m r_{ds})^2$ assuming that the transistors are all equally sized. Thus, this technique has squared the differential gain of the block. In illustrative embodiments, Q1-Q3 and J1-J4 are n-type depletion mode GaN FETs.

FIG. 7 shows the design of the high side current mirror using GaN depletion mode devices in accordance with illustrative embodiments of the invention. The top rail of the circuit is coupled to a voltage source, such as a constant voltage source that is typically designated Vdd. Device J1 and resistor R1 are used to realize a simple current source as explained earlier. Device J2 implements the gain enhancement for the differential pair. Device J3 and J4 are used to maintain a fixed voltage (e.g., about 2 $V_T$) across the drain-source of J2 and J1 to further improve the output impedance. From FIG. 7 the output voltage is fed back to the gate of transistor J1. Due to the threshold voltage of the depletion mode transistor being approximately 3V the voltage at the source of J1 is Vo plus approximately 3V. This voltage is also seen at the gate of transistor J2. Thus, the voltage at the source of J2 is Vo plus 2 Vt, which is Vo~+6V. This voltage feeds the gate of transistor J4 which is part of the cascode circuit. The voltage at the source of J4 is Vo~+9V. The source voltage of the J4 transistor is the same voltage as the gate voltage of transistor J3. Therefore, the source voltage of transistor J3 is Vo~+12V. As a result, the drain to source voltages of transistors J1 and J2 are substantially constant at 2 Vt or 6V independent of the output voltage.

Figure 8:
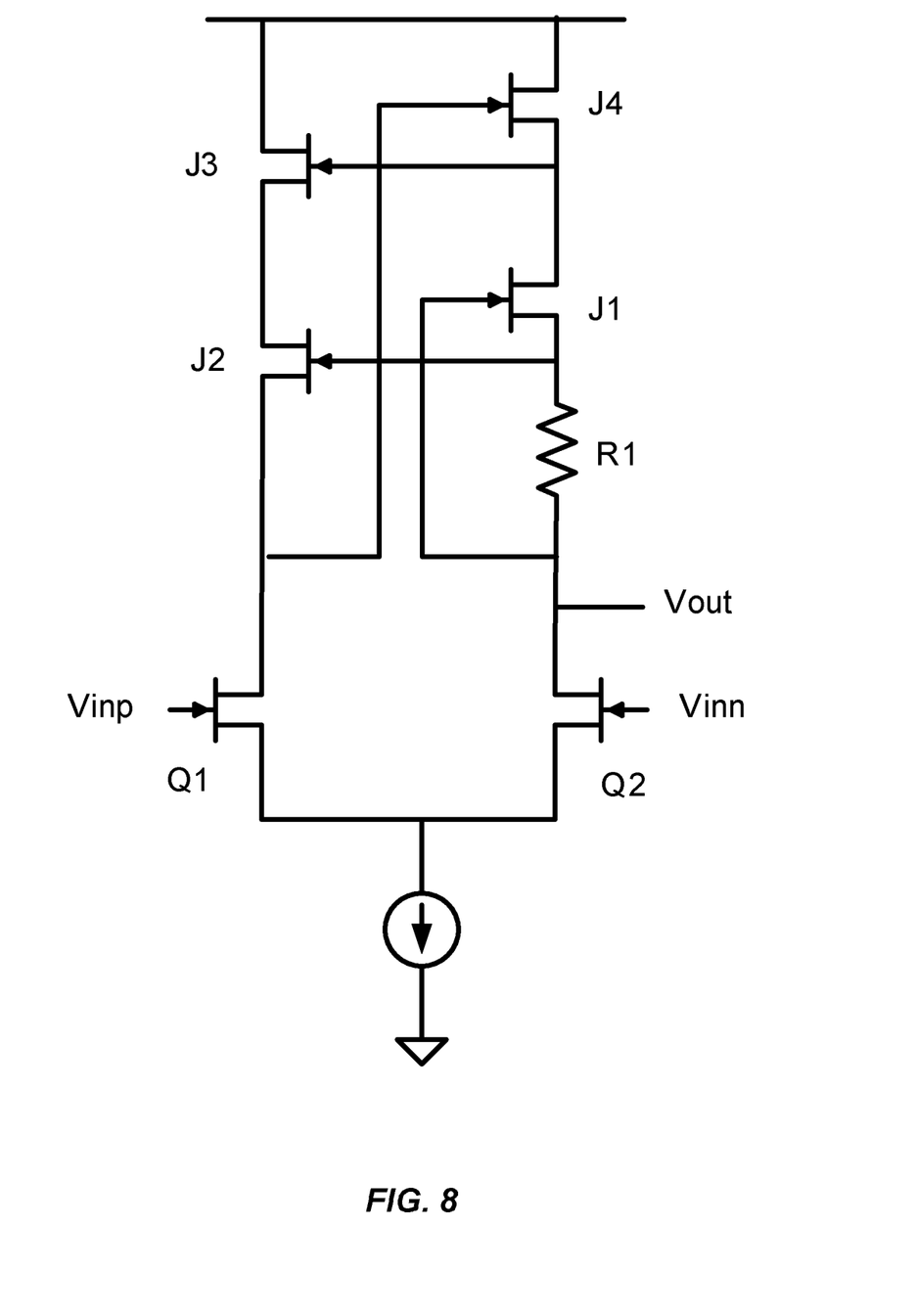
FIG. 8 schematically shows a full gain stage showing the differential pair with the high side current mirror using depletion mode devices in accordance with illustrative embodiments of the invention.

It should be recognized by holding the voltage across the drain-source junction to a constant value, the output impedance is further increased. When the devices are biased roughly at the same current density, the output impedance of the high side current mirror at the output is $g_m r_{ds}^2$ FIG. 8 schematically shows the full gain stage showing the differential pair (Q1, Q2) with the high side current mirror (J1-J4 and R) in accordance with illustrative embodiments of the invention. The differential pair Q1 and Q2 may both be n-type transistors. In an alternative embodiment, the differential pair Q1 and Q2 may be constructed from n-type enhancement mode devices. All of the remaining transistors in such an embodiment (J1-J4) would remain n-type depletion mode transistors. This embodiment would function similarly to the circuit that uses only n-type depletion mode transistors.

Figure 9:
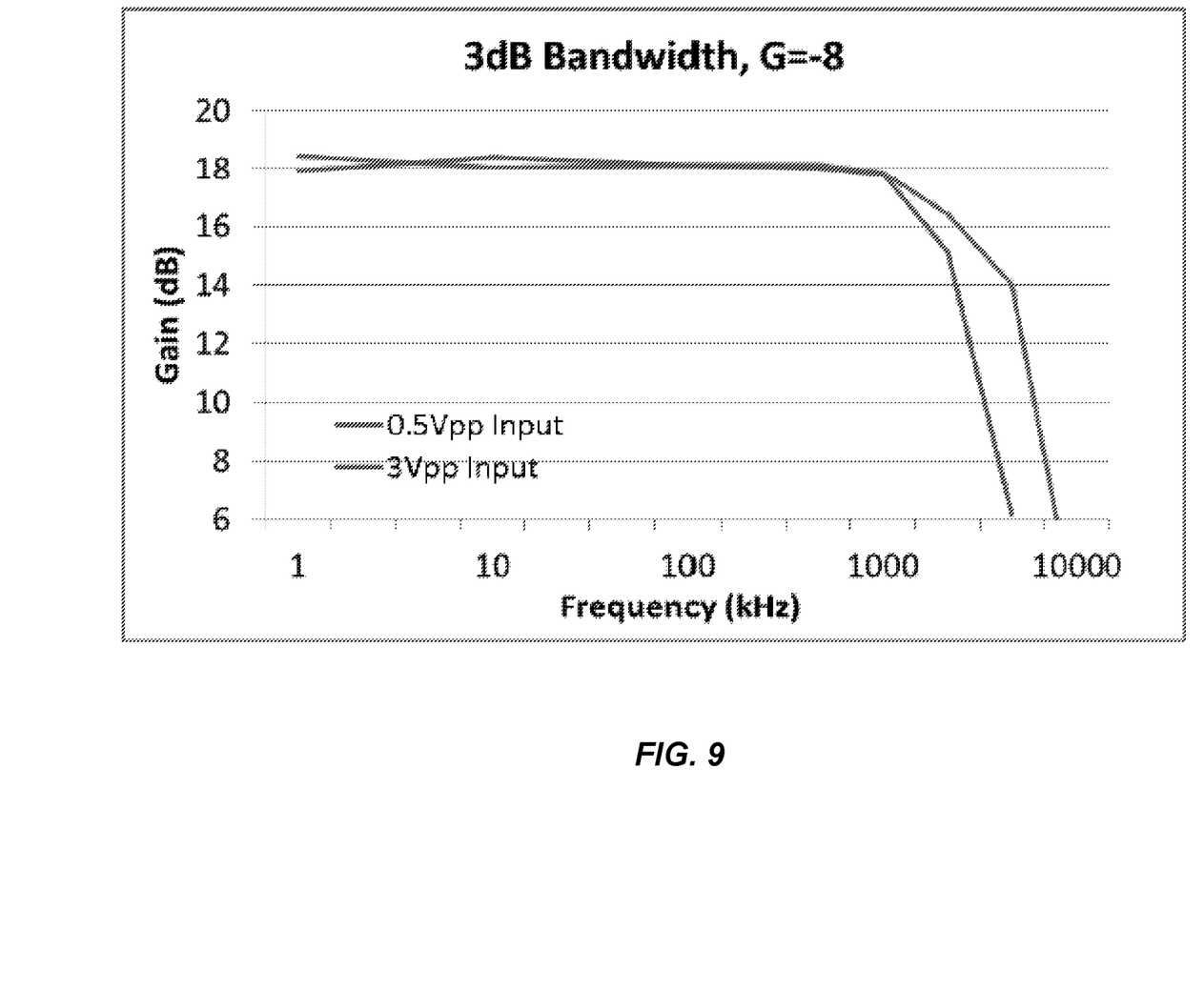
FIG. 9 is a graph that shows that a tested version of the circuit of FIG. 8 has has a gain bandwidth product of 40 MHz.
Figure 10:
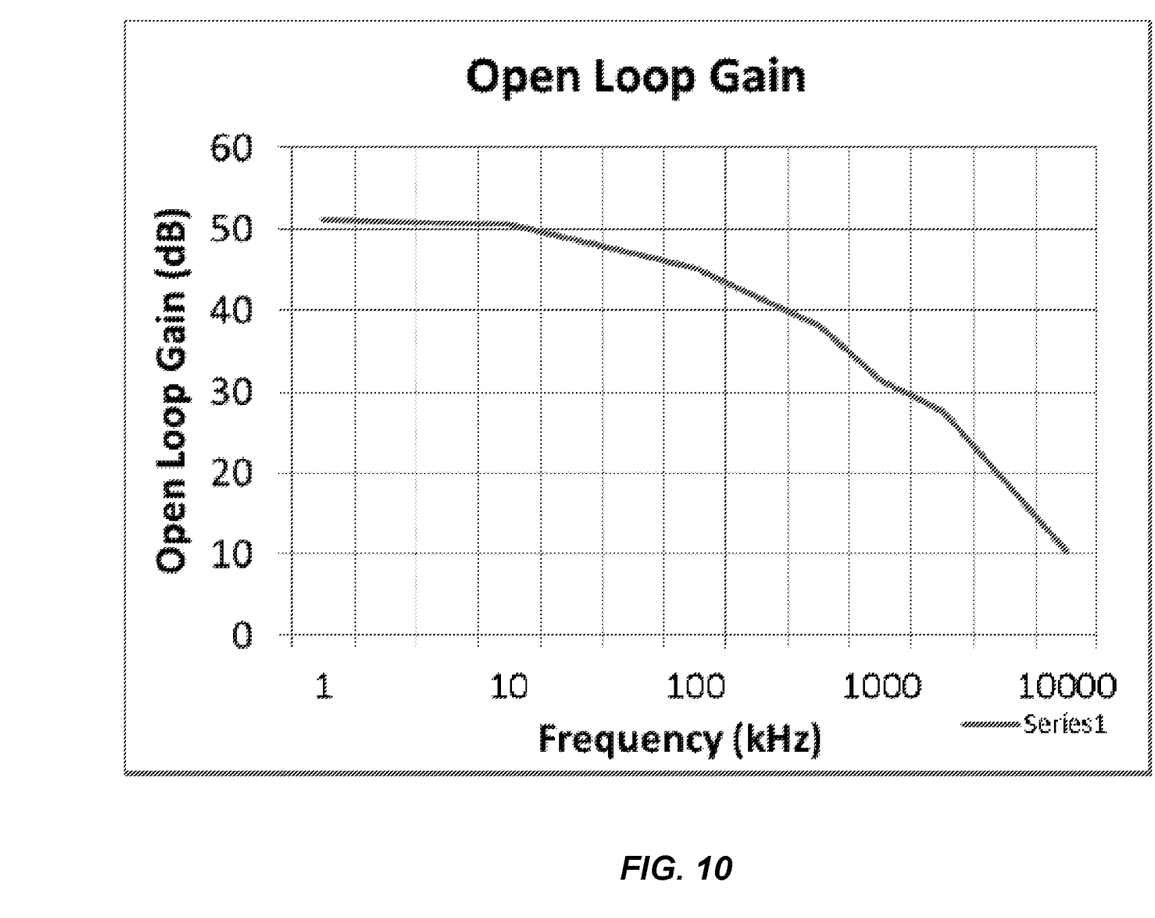
FIG. 10 is a graph that shows that a tested version of the circuit of FIG. 8 has a differential DC open loop gain of approximately 400.

The circuit of FIG. 8 was fabricated and measurements showed that this input stage has a differential DC gain of 400 as show in FIG. 10 and a gain bandwidth product of 40 MHz at 150V power supply as shown in FIG. 9. The above circuit is one of the important ways of enhancing the differential gain of a differential pair using n-type GaN depletion mode devices only in a GaN fabrication process.

Although the above discussion discloses various exemplary embodiments of the invention, it should be apparent that those skilled in the art can make various modifications that will achieve some of the advantages of the invention without departing from the true scope of the invention.

We claim:

1. A depletion mode differential pair gain stage comprising:
a differential pair of depletion-mode transistors, including a first and a second depletion mode transistor, the first and second depletion mode transistors of the differential pair of depletion mode transistors having a gate, source, and a drain, the differential pair of depletion-mode transistors coupled at the source to form a common node; and
an active load including one or more depletion mode transistors electrically coupled to at least one of the drains of the first and second depletion mode transistors of the differential pair, wherein the active load includes a current source formed from a third depletion mode transistor coupled to an output node of the differential pair via a resistor, the current source electrically coupling the gate of the third depletion mode transistor to the drain of the second depletion mode transistor to source current from the third depletion mode transistor to the second depletion mode transistor via the resistor.

2. A depletion mode differential pair gain stage according to claim 1 wherein a source terminal of the third depletion mode transistor is electrically connected to a first terminal of the resistor and a second terminal of the resistor provides an output voltage node of the differential pair gain stage.

3. A depletion mode differential pair gain stage according to claim 1, further comprising a fourth depletion mode transistor having a gate terminal coupled to and biased at a voltage of the source terminal of the third depletion mode transistor, and wherein the fourth depletion mode transistor includes a source terminal coupled to a drain terminal of the first depletion mode transistor.

4. A depletion mode differential pair gain stage according to claim 1, wherein the active load includes a buffer formed from at least a fourth depletion mode transistor electrically coupling the drains of the first and second depletion mode transistors of the differential pair.

5. A depletion mode differential pair gain stage according to claim 1 wherein the transistors are compound semiconductor field effect transistors.

6. A depletion mode differential pair gain stage according to claim 4 wherein the buffer has a substantially unity gain, and the source of the fourth depletion mode transistor is connected to a drain of the first depletion mode transistor.

7. A depletion mode differential pair gain stage according to claim 6 wherein the fourth depletion mode transistor has its gate electrically coupled to a source terminal of the third depletion mode transistor forming a source follower such that the gate of the fourth depletion mode transistor and the source terminal of the third depletion mode transistor are at the same potential.

8. A depletion mode differential pair gain stage according to claim 7 wherein during operation of the gain stage the buffer keeps AC voltage at the drains of the differential pair at the same potential.

9. A depletion mode differential pair gain stage according to claim 8 wherein the active load includes a cascode stage formed from at least two additional depletion mode transistors.

10. A depletion mode differential pair gain stage according to claim 9 wherein the cascode stage maintains a fixed voltage above the threshold voltage of the depletion mode transistor at the source of at least the fourth depletion mode transistor that forms the source follower.

11. A depletion mode differential pair gain stage according to claim 1 wherein each depletion mode transistor is an n-type gallium nitride depletion mode transistor.

12. A gallium nitride differential pair gain stage comprising:
a differential pair of n-type gallium nitride transistors, including a first and a second depletion mode transistor, the first and second depletion mode transistors having a gate, source, and a drain, the differential pair coupled at the source to form a common node; and
an active load including a current source formed from a third n-type gallium nitride depletion mode transistor coupled to an output node of the differential pair via a resistor, the current source electrically coupling the gate of the third n-type gallium nitride depletion mode transistor to the drain of the second n-type gallium nitride depletion mode transistor and a buffer formed from at least a fourth n-type gallium nitride depletion mode transistor electrically coupling the drains of the first and second n-type gallium nitride transistors of the differential pair to the same AC voltage.

13. A gallium nitride differential pair gain stage according to claim 12 wherein the active load includes a cascode stage formed from at least two additional n-type gallium nitride transistors.

14. A gallium nitride differential pair gain stage according to claim 13 wherein the cascode stage maintains a fixed voltage across the drain and source of the fourth depletion mode transistor that forms the source follower thereby increasing the output impedance of the gallium nitride differential pair gain stage as compared to differential pair gain stage without the cascode stage.

15. A differential pair gain stage comprising:
a differential pair of n-type depletion mode transistors, including a first and a second transistor, the first and a second transistors having a gate, source, and a drain, the differential pair coupled at the source to form a common node; and
an active load electrically coupled to at least one of the drains of the n-type depletion mode transistors of the differential pair, the active load containing only n-type depletion mode transistors, wherein the active load includes a current source formed from an n-type depletion mode transistor coupled to an output node of the differential pair gain stage via a resistor having a terminal that provides the output node of the differential pair gain stage.

16. A differential pair gain stage according to claim 15 wherein the active load includes a current source formed from an n-type depletion mode transistor coupled to a resistor that is biased to provide at least a depletion mode threshold voltage magnitude across the resistor when a tail current biasing the differential pair flows through the resistor.

17. A differential pair gain stage according to claim 15, wherein the active load includes a buffer having an n-type depletion mode transistor to couple the drains of the transistors of the differential pair to have the same AC voltage.

18. A differential pair gain stage according to claim 17 wherein the buffer has a substantially unity gain.

19. A differential pair gain stage according to claim 18 wherein the active load includes a cascode stage formed from at least two n-type depletion mode transistors.

20. A differential pair gain stage according to claim 19 wherein the cascode stage maintains a fixed voltage across a drain source junction of the depletion mode transistor in the buffer.

21. A depletion mode differential pair gain stage comprising:
a differential pair of depletion-mode transistors, including a first and a second depletion mode transistor, the first and second depletion mode transistors of the differential pair of depletion mode transistors having a gate, source, and a drain, the differential pair of depletion-mode transistors coupled at the source to form a common node; and
an active load including one or more depletion mode transistors electrically coupled to at least one of the drains of the first and second depletion mode transistors of the differential pair, wherein the active load includes a current source formed from a third depletion mode transistor coupled to an output node of the differential pair via a resistor, the current source electrically coupling the gate of the third depletion mode transistor to the drain of the second depletion mode transistor to source current from the third depletion mode transistor to the second depletion mode transistor via the resistor;
wherein the active load includes a buffer formed from at least a fourth depletion mode transistor electrically coupling the drains of the first and second depletion mode transistors of the differential pair;
wherein the buffer has a substantially unity gain, and the source of the fourth depletion mode transistor is connected to a drain of the first depletion mode transistor; and
wherein the fourth depletion mode transistor has its gate electrically coupled to a source terminal of the third depletion mode transistor forming a source follower such that the gate of the fourth depletion mode transistor and the source terminal of the third depletion mode transistor are at the same potential.

22. A depletion mode differential pair gain stage according to claim 21, wherein during operation of the gain stage the buffer keeps AC voltage at the drains of the differential pair at the same potential.

23. A depletion mode differential pair gain stage according to claim 22, wherein the active load includes a cascode stage formed from at least two additional depletion mode transistors.

24. A depletion mode differential pair gain stage according to claim 23, wherein the cascode stage maintains a fixed voltage above the threshold voltage of the depletion mode transistor at the source of at least the fourth depletion mode transistor that forms the source follower.

* * * * *